United States Patent [19]

Mahabadi

[11] Patent Number: 4,885,476

[45] Date of Patent: Dec. 5, 1989

[54] POWER-ON RESET CIRCUIT

[75] Inventor: John K. Mahabadi, Tempe, Ariz.

[73] Assignee: Motorola, Inc., Schaumburg, Ill.

[21] Appl. No.: 319,247

[22] Filed: Mar. 6, 1989

[51] Int. Cl.[4] .................... H03K 17/22; H03K 17/20; H03K 17/687; H03K 5/153

[52] U.S. Cl. ................................ 307/272.3; 307/594; 307/296.5

[58] Field of Search .............. 307/592, 594, 593, 596, 307/597, 603, 605, 272.3, 296.5, 296.1, 296.6

[56] References Cited

U.S. PATENT DOCUMENTS

| | | | |
|---|---|---|---|
| 4,591,745 | 5/1986 | Shen | 307/594 X |
| 4,698,531 | 10/1987 | Jones | 307/592 |
| 4,717,840 | 1/1988 | Ouyang et al. | 307/592 X |
| 4,812,679 | 3/1989 | Mahabadi | 307/592 X |

Primary Examiner—Stanley D. Miller
Assistant Examiner—David R. Bertelson
Attorney, Agent, or Firm—Michael D. Bingham

[57] ABSTRACT

A power-on reset circuit includes a start-up voltage generator circuit which produces a voltage which is insensitive to changes in the threshold voltages of the field effect transistors contained therein. The start-up voltage then controls a trigger voltage for sheering a current to a capacitor, the current being provided by a switchable current source. The capacitor charges, therein introducing a delay into the generation of the reset signal. The reset signal is fedback to the start-up voltage generator circuit to reduce the steady state current drawn by the power-on reset circuit. A test terminal is provided to force the reset signal to go low for in circuit testing. This also provides a means for resetting internal memory elements which may be couple to the output of the power-on reset circuit to a known state.

11 Claims, 1 Drawing Sheet

POWER-ON RESET CIRCUIT

FIELD OF THE INVENTION

This invention relates in general to the field of power-on reset circuits and more particularly to a power-on reset circuit which is insensitive to transistor threshold voltage variations and consumes substantially zero power in steady state.

BACKGROUND OF THE INVENTION

A power-on reset (POR) circuit, as that term is used herein, is a circuit which produces a delayed output signal in response to the initial application of power to the circuit or upon momentary interruption of the power. Such circuits may be used, for example, for placing counters, registers, memories, or other circuits in a desired initial condition.

Selection of a power-on reset circuit for a particular application may involve one or more of the following criteria: static and dynamic response, operating voltage range, steady state power dissipation, and ease of implementation in integrated circuit form. The static and dynamic response should be such that the circuit operation is essentially independent of the supply voltage rise time. The operating voltage range should be such that the reset circuit does not require more voltage than the device with which it is to be used which otherwise would limit the operating range of the utilization device. The steady state power dissipation should be minimal and, ideally, zero. Finally, the circuit should not require a great deal of silicon area when implemented as an integrated circuit.

A problem often encountered in Metal Oxide Semiconductor (MOS) circuits is a sensitivity to variations in transistor threshold voltages. Typically, a switching point for determining when to begin the generation of the output signal is based on the threshold voltages of several MOS transistors. Variations, then, in the transistor threshold voltages due to processing variations will cause undesired changes in the switching point and hence the timing of the output signal, or worse no output signal.

Thus, what is needed is a power-on reset circuit which is insensitive to transistor threshold voltage variations and consumes substantially zero power in steady state.

SUMMARY OF THE INVENTION

Accordingly, it is an object of the present invention to provide an improved power-on reset circuit.

It is a further object of the present invention to provide an improved power-on reset circuit which is insensitive to variations in transistor threshold voltages.

It is yet a further object of the present invention to provide an improved power-on reset circuit which consumes less power.

In carrying out the above and other objects of the invention in one form, there is provided an MOS power-on reset circuit having at least one threshold voltage for generating a reset signal when a $V_{DD}$ supply voltage is applied to the power-on reset circuit. The power-on reset circuit comprises a first means coupled to the $V_{DD}$ supply voltage for generating a start-up voltage wherein the start-up voltage is substantially unaffected by variations in the power-on reset circuit threshold voltages; a second means is coupled to the first means for generating a trigger voltage in response to the start-up voltage; a current is source coupled to the $V_{DD}$ supply voltage for providing a current; a first capacitor is coupled between the current source and a ground supply voltage and is charged by the current source when the trigger voltage is low; a third means is coupled to the current source and to the second means and is responsive to the trigger voltage for steering a current from said current source to said first capacitor; and a driver stage is coupled to the capacitor for producing the reset signal and is further coupled to the first means for reducing the steady state current to substantially zero.

The above and other objects, features, and advantages of the present invention will be better understood from the following detailed description taken in conjunction with the accompanying drawings.

DETAILED DESCRIPTION OF THE INVENTION

Figure 1:
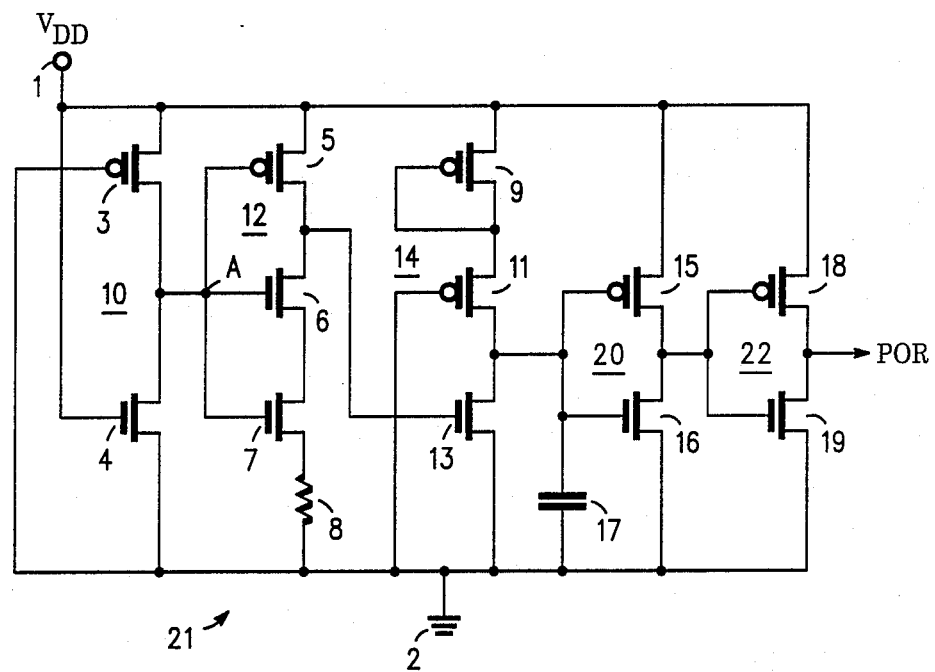
FIG. 1 is a schematic diagram of a prior art power-on reset circuit.

Referring to FIG. 1, a power-on reset circuit 21 is shown which produces a reset signal when a supply voltage, $V_{DD}$, is applied. The power on reset circuit 21 comprises field effect transistors 3-7, 9, 11, 13, 15, 16, 18, and 19, and a resistor 8 and a capacitor 17. Patent application, Ser. No. 07/118,074, filed on Nov. 9, 1987, describes the power-on reset circuit 21, the teachings of which are incorporated herein by the reference made thereto. A voltage generating stage 10 is coupled between supply voltage terminals 1 and 2 for generating a start-up voltage which is detected by a threshold detecting stage 12 which is coupled to the voltage generating stage 10. When the start-up voltage has reached a predetermined value, the threshold detecting stage 12 will provide a trigger voltge which is received by the field effect transistor 13. When the field effect transistor 13 is off (i.e., the trigger voltage is low), a current from the current source 14 is "steered" to the capacitor 17.

A time delay is introduced by the charging of the capacitor 17 which causes a driver stage comprised of inverters 20 and 22 to provide a delayed output which is the Power-On Reset (POR) signal. While the power-on reset circuit 21 provides an adequate POR signal, it is somewhat sensitive to changes in the threshold voltages of the field effect transistors contained therein. Field effect transistors 3 and 4, for example, set up the start-up voltage which is dependent on the threshold voltage of both field effect transistors 3 and 4. Since the field effect transistors 3 and 4 are of different types (P type versus N type, respectively), changes in the threshold voltages won't track (i.e., offset each other). This results in a shift in the magnitude of the start-up voltage. If the field effect transistor 4 were replaced by a capacitor, a reduction may be realized in the steady state current (supply voltage $V_{DD}$ is stable and the POR signal has been generated) that is being drawn by the power-on reset circuit 21. But the start-up voltage would still be sensitive to changes in the threshold voltage of the field effect transistor 3.

Figure 2:
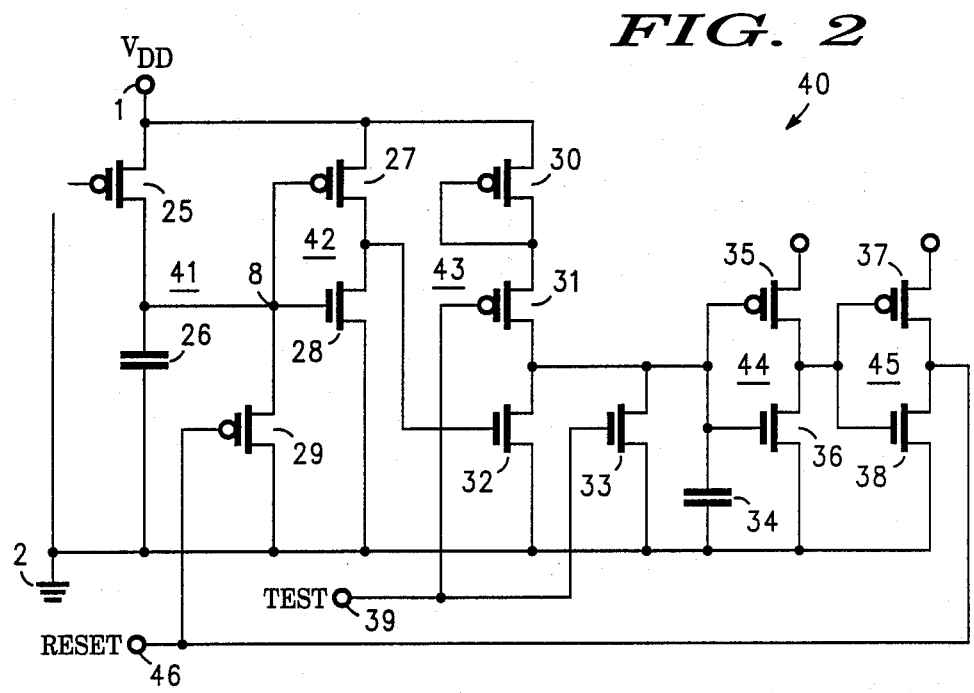
FIG. 2 is a schematic diagram of the preferred embodiment.

An improved power-on reset circuit 40 is illustrated in FIG. 2. The power-on reset circuit 40 generates a start-up voltage at a node B which is insensitive to changes in the threshold voltages of the field effect transistors comprising the power-on reset circuit 40. A start-up voltage generator 41 comprises a field effect transistor 25 having a source connected to a supply voltage terminal 1 for receiving the $V_{DD}$ voltage, a gate connected to the ground supply terminal 2, and a drain connected to the node B and also coupled to the group supply terminal 2 by a capacitor 26. A field effect transistor 29 has a source connected to the ground supply terminal 2, a drain connected to the node B, and a gate connected to an output terminal 46 for receiving a reset signal.

When the $V_{DD}$ supply voltage is first applied, the field effect transistor 25 is in an off condition and the field effect transistor 29 is in the conducting state since its gate starts off at the ground supply voltage potential which holds the node B low. As $V_{DD}$ exceeds the threshold voltage of the field effect transistor 25, it begins to conduct thus supplying current to the capacitor 26 and the field effect transistor 29. The magnitude of the voltage at the node B will be dependent on the ratio of the transistor sizes of the field effect transistors 25 and 29. The field effect transistors 25 and 29 essentially form a voltage divider network based on the relative conductances of their channels. As will be seen later, when the reset signal goes high, the field effect transistor 29 will turn off and the voltage at the node B is maintained by the charge on the capacitor 26. Hence only a leakage current, which is negligible, will be drawn during steady state. Furthermore, since the voltage divider action is provided by two field effect transistors of the same channel type, a variation in the threshold voltage in one will be tracked by a similar threshold voltage in the other to maintain an accurate start-up voltage.

A threshold detector 42 receives the start-up voltage and in turn generates a trigger voltage. The threshold detector 42 includes field effect transistors 27 and 28 having their gates connected to the node B, their sources connected to the supply and ground voltage terminals 1 and 2, respectively, and having their drains connected together. At the initial application of power, the field effect transistor 27 is on and the field effect transistor 28 is off, thus causing the output at their drains, the trigger voltage, to be high. When the start-up voltage reaches a predetermined magnitude (the magnitude necessary to turn off the field effect transistor 27 off and the field effect transistor 28 on), the trigger voltage will go low. The trigger voltage controls a current that is provided by a switchable current source 43 which comprises field effect transistors 30, 31, and 33, and a test terminal 39.

The field effect transistor 30 is coupled as a diode having a source connected to the supply voltage terminal 1, and a gate and a drain connected to the source of the field effect transistor 31. The field effect transistors 31 and 33 each have a gate connected to the test terminal 39 for receiving a test signal, a drain connected together, and a source of the field effect transistor 33 is connected to the ground voltage terminal 2. The test signal is low during normal operation which turns the field effect transistor 31 on and the field effect transistor 33 off. This allows the switchable current source 43 to provide the necessary current. A field effect transistor 32 acts to steer the current under control of the trigger voltage. The field effect transistor 32 has a drain connected to the drains of the field effect transistors 31 and 33, a gate connected to the drain of the field effect transistor 27, and a source connected to the ground voltage terminal 2.

When the trigger voltage is high (i.e., power initially applied) the field effect transistor 32 will be conducting which sinks the current from the switchable current source 43 to the ground voltage terminal 2. As the trigger voltage decreases in magnitude (in response to the start-up voltage), the field effect transistor 32 begins to turn off. This in turns steers the current to charge up a capacitor 34 which is coupled from the drain of the field effect transistor 32 to the ground voltage terminal 2. The voltage developed across the capacitor 34 is applied to a driver stage which is made up of inverters 44 and 45. Inverter 44 includes field effect transistors 35 and 36 each having a gate connected to the drain of the field effect transistor 32, a drain connected together, and a source connected to the supply and ground voltage terminals 1 and 2, respectively. the Inverter 45 includes the field effect transistors 37 and 38 each having a gate connected to the drains of the field effect transistors 35 and 36, a drain connected to the output terminal 46, and a source connected to the supply and ground voltage terminals 1 and 2, respectively.

Charging the capacitor 34 creates a delay equal to the time necessary to charge the capacitor 34 to a voltage sufficient to invert the output of the inverter 44. Inverter 45 then inverts causing the reset signal at the output terminal to go high and the power-on reset has been accomplished. Since the reset signal is fedback to the field effect transistor 29, the field effect transistor 29 will now turn off which decreases the power consumed by the power-on reset circuit 40, therein placing the power-on reset circuit in a steady state condition. A momentary loss of power will cause the start-up voltage to be discharged to the ground voltage terminal 2, and the cycle will repeat generating another reset signal.

The power-on reset circuit 40 may be tested by bringing the test signal high. This turns off the field effect transistor 31 which turns off the switchable current source 43. The field effect transistor 33 turns on to discharge the capacitor 34 which causes the reset signal to go low. This would also be an effective method for reinitalizing registers, etc which may be coupled to the output of the power on reset circuit 40 without disrupting power.

It should be appreciated that the power-on reset circuit 40 is well suited for providing the power-on reset function in custom as well as in semicustom applications. In standard cell integrated circuits, the power-on reset circuit could be implemented in a cell which would be useful over a broad spectrum of applications. This is due to the simplicity of the circuit, and due to its insensitivity to threshold variations and low power drain.

By now it should be appreciated that there has been provided a power-on reset circuit which is insensitive to transistor threshold voltage variations and consumes substantially zero power in steady state.

I claim:

1. An MOS power-on reset circuit having at least one threshold voltage for generating a reset signal when a first supply voltage is applied to said power-on reset circuit, comprising;

first means coupled to the first supply voltage for generating a start-up voltage wherein the start-up voltage is substantially unaffected by variations in said at least one threshold voltage;

second means coupled to said first means for generating a trigger voltage in response to the start-up voltage;
a current source coupled to the first supply voltage;
a first capacitor coupled between said current source and a second supply voltage;
third means coupled to said current source and to said second means and responsive to the trigger voltage for steering a current from said current source to said first capacitor; and
a driver means coupled to said first capacitor for producing the reset signal and further coupled to said first means for reducing the steady state current to substantially zero.

2. The MOS power-on reset circuit according to claim 1 wherein said first means further comprises:
a first field effect transistor having a source coupled to the first supply voltage, a gate coupled to the second supply voltage, and having a drain;
a second capacitor coupled betwen the drain of said first field effect transistor and the second supply voltage; and
a second field effect transistor having a source coupled to the second supply voltage, a gate coupled to said driver means for receiving the reset signal, and a drain coupled to the drain of sid first field effect transistor.

3. The MOS power-on reset circuit according to claim 2 wherein said second means further comprises:
a third field effect transistor having a source coupled to the first supply voltage, a gate coupled to the drain of said second field effect transistor, and a drain coupled to said third means; and
a fourth field effect transistor having a source coupled to the second supply voltage, a gate coupled to the gate of said third field effect transistor, and a drain coupled to the drain of said third field effect transistor.

4. The MOS power-on reset circuit according to claim 3 wherein said third means further comprises a fifth field effect transistor having a source coupled to the second supply voltage, a drain coupled to said current source, and a gate coupled to the drain of said third field effect transistor.

5. The MOS power-on reset circuit according to claim 4 wherein said driver means further comprises:
a first inverter having an input coupled to the drain of said fifth field effect transistor, and having an output; and
a second inverter having an input coupled to the output of said first inverter and having an output coupled for providing the reset signal.

6. An MOS power-on reset circuit having a plurality of field effect transistors, said plurality of field effect transistors having a threshold voltage, for generating a reset signal when a first supply voltage is applied, said power-on reset circuit consuming substantially zero current when in a steady state condition, comprising:
a first supply voltage terminal for receiving the first supply voltage;
a second supply voltage terminal for receiving a second supply voltage;
first means coupled between said first and second supply voltage terminals for generating a start-up voltage at an output thereof wherein the generation of the start-up voltage is independent of variations in the threshold voltage;
a first field effect transistor having a source coupled to said first supply voltage terminal, a gate coupled to the output of said first means, and having a drain;
a second field effect transistor having a source coupled to said second supply voltage terminal, a gate coupled to the gate of said first field effect transistor, and having a drain coupled to the drain of said first field effect transistor;
a switchable current source coupled to said first supply voltage terminal;
second means coupled to said switchable current source for receiving a current and coupled to the drain of said first field effect transistor for receiving a trigger voltage;
a first capacitor coupled between said second means and said second supply voltage terminal; and
a driver means coupled to said first capacitor and to said first means for providing a reset signal.

7. The MOS power-on reset circuit according to claim 6 wherein said first means further comprises:
a third field effect transistor having a source coupled to said first supply voltage terminal, a gate coupled to said second supply voltage terminal, and having a drain;
a second capacitor coupled between the drain of said third effect transistor and said second supply voltage terminal; and
a fourth field effect transistor having a source coupled to said second supply voltage terminal, a gate coupled to said driver means for receiving the reset signal, and a drain coupled to the drain of said third field effect transistor and coupled to the gate of said first field effect transistor.

8. The MOS power-on reset circuit according to claim 7 wherein said switchable current source further comprises:
a test terminal for receiving a test signal;
a fifth field effect transistor having a source coupled to said first supply voltage terminal, and having a gate coupled to a drain;
a sixth field effect transistor having a source coupled to the drain of said fifth field effect transistor, a gate coupled to said test terminal; and having a drain coupled to said second means; and
a seventh field effect transistor having a source coupled to said second supply voltage terminal, a gate coupled to said test terminal, and a drain coupled to the drain of said sixth field effect transistor.

9. The MOS power-on reset circuit according to claim 8 wherein said second means comprises an eighth field effect transistor having a source coupled to said second supply voltage terminal, a gate coupled to the drain of said first field effect transistor, and having a drain coupled to thd drain of said sixth field effect transistor.

10. The MOS power-on reset circuit according to claim 9 wherein said driver means further comprises:
a first inverter having an input coupled to the drain of said sixth field effect transistor, and having an output; and
a second inverter having an input coupled to the output of said first inverter and having an output coupled for providing the reset signal and coupled to the gate of said fourth field effect transistor.

11. The MOS power-on reset circuit according to claim 10 wherein said power-on reset circuit is implemented as a standard cell.

* * * * *